Sept. 23, 1958 R. H. ARTHUR ET AL 2,853,565

PRINTED CIRCUIT SWITCH CONSTRUCTIONS

Filed March 28, 1957 2 Sheets-Sheet 1

INVENTORS
RONALD H. ARTHUR
DONALD G. HEBERT
BY Thomas S. Ross
Joseph R. Spalla
ATTORNEYS Sept. 23, 1958 R. H. ARTHUR ET AL 2,853,565

PRINTED CIRCUIT SWITCH CONSTRUCTIONS

Filed March 28, 1957 2 Sheets-Sheet 2

INVENTORS
RONALD H. ARTHUR
DONALD G. HEBERT
BY Thomas S. Ross
Joseph R. Spalla
ATTORNEYS United States Patent Office 2,853,565
Patented Sept. 23, 1958

2,853,565

PRINTED CIRCUIT SWITCH CONSTRUCTIONS

Ronald H. Arthur, West Hartford, and Donald G. Hebert, Wapping, Conn., assignors to Royal McBee Corporation, Port Chester, N. Y., a corporation of New York Application March 28, 1957, Serial No. 649,098
1 Claim. (Cl. 200—16)

This invention relates generally to switches; more particularly it relates to two condition or double throw push button switch constructions incorporating printed wiring circuits; and specifically it relates to a small compact slide switch construction having an optimum number of ganged transfer contacts which control the energization of the printed wiring circuits.

In many switch applications it is desirable to have a small compact switch and since the internal wiring arrangements and the number of terminal points thereto determine the number of functions which a particular switch may perform, one which has an optimum number of terminal points to which external circuitry may be connected. The number of terminal points that may be incorporated in a switch construction is limited by the physical size of the switch unit, which contains the internal wiring arrangements that are embedded in plastic insulation, the movable contact holder, and by the space requirements necessary between terminal points in order that external circuitry may be soldered or clamped thereto in insulated relationship to one another.

This invention resides in a compact switch construction wherein an optimum number of circuits are provided in a minimum of space through the use of printed circuits and novel terminal connecting means. Briefly, the invention is an improved slide switch having a plunger which cooperates with a reliable two position rotary latch mechanism. The plunger carries a spring biased insulating block on which a plurality of poles or brush contact arrangements are mounted. In combination with selected printed circuitry placed on or formed integral with the switch walls, switching is accomplished by the brush contacts which slide over and bridge different printed circuits upon movement of the plunger. An insulating terminal block is also provided between the walls of the switch housing which enables tapered terminals of external wiring to be securely joined to the printed circuit terminals without the necessity for soldering. The construction further incorporates illuminable means for indicating the position of the plunger.

An object of the invention therefore is to provide a small compact push button switch which is simply fabricated and reliable in operation over long periods of time and which is readily adaptable to a variety of uses.

Another object of the invention is to provide a plunger switch construction incorporating a reliable two position rotary latch.

Another object of the invention is the provision of a small compact printed circuit switch construction incorporating a plurality of ganged electrically independent double pole double throw switches and illuminable means for indicating the position of all the switches.

Another object of the invention is the provision of a maintenance free switch construction to which external wiring may be positively secured without the necessity for soldered connections.

A further object of the invention is to provide a sliding switch construction having an optimum number of transfer or break-before-make contacts and an optimum number of wire plugging connections in a minimum of area.

A still further object of the invention is to provide a sliding switch construction adapted to utilize selectable internal printed circuit wiring arrangements which may be interchanged to meet the requirements of a particular application thereby to provide a more versatile switching unit.

Other objects and many of the attendant advantages of this invention will be readily appreciated as the same becomes better understood by reference to the following detailed description when considered in connection with the accompanying drawings in which like reference numerals designate like parts throughout the figures thereof and wherein.

Figure 1:
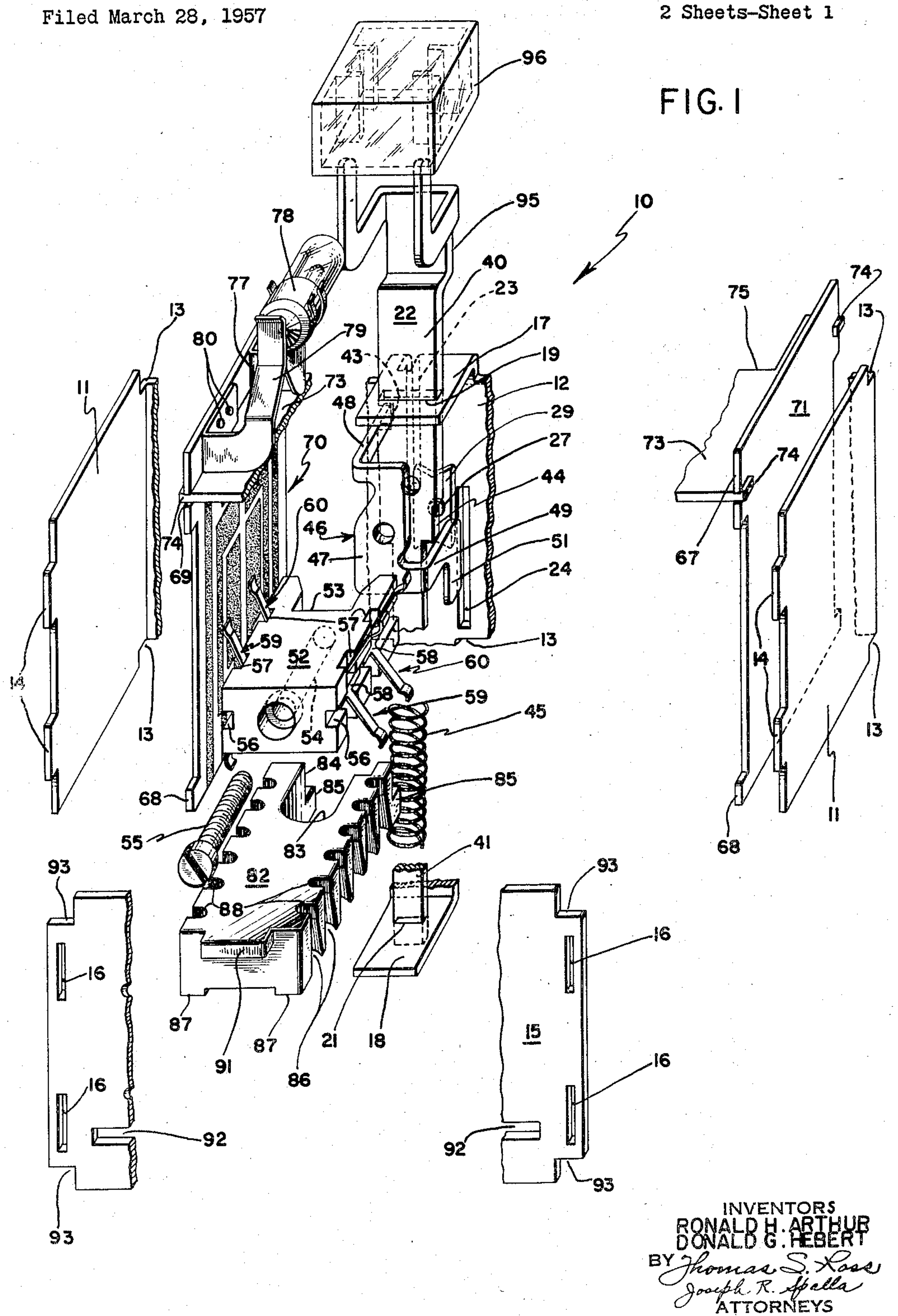
Fig. 1 is an exploded perspective view of a switch constructed in accordance with the invention.

Referring now to the drawings wherein like reference characters designate like or corresponding parts throughout the several views there is shown in Fig. 1, which illustrates a preferred embodiment, a switch unit, generally designated by reference numeral 10. The unit comprises a housing in the form of an open rectangular channel having side walls 11 and a bottom wall 12. The side walls 11 of the channel are wider than the width of the bottom wall 12 and in the specific embodiment the corners formed by the side and bottom walls of the housing are provided with notches 13 adapted to maintain printed circuit panels within the housing as will be apparent infra. The forward edges of the side walls 11 are provided with forwardly extending lugs 14 whereby after the switch is assembled, as will be explained hereinafter, a cover plate 15 having slots 16 complementary to the lugs 14 may be attached.

The bottom wall 12 of the housing has formed on its upper and lower edges forwardly projecting extensions 17 and 18, respectively, which are provided with guide slots 19 and 21 that are adapted to receive in sliding relation a plunger generally designated by reference numeral 22. The bottom wall 12 is also formed with two parallel slots 23 and 24 spaced different predetermined distances to either side of the bottom wall longitudinal centerline. One slot 23 extends from around the extension 17 down toward a hole 26 (Fig. 4) which is stamped, punched or bored on the longitudinal centerline of the bottom wall of the switch housing on or near its geometric center. The other slot 24 extends from adjacent the lower edge of the bottom wall to beyond the hole 26.

A rotatable switch latch cam 29 is secured by a rivet 27 or the like to the hole 26. The switch latch cam 29 (Fig. 5) is rectangular in shape with isosceles triangular sections 31 and 32, whose base sides are equal to the cam's width, cut out from the shorter dimensioned ends thereof. The switch latch cam's width is such that when disposed with its long dimension parallel to the slots 23 and 24 (Fig. 3) one side has its edge 33 flush with the inner edge 34 of slot 24 and the other side has its edge 35 intermediate the edges 36 of slot 23.

Figure 3:
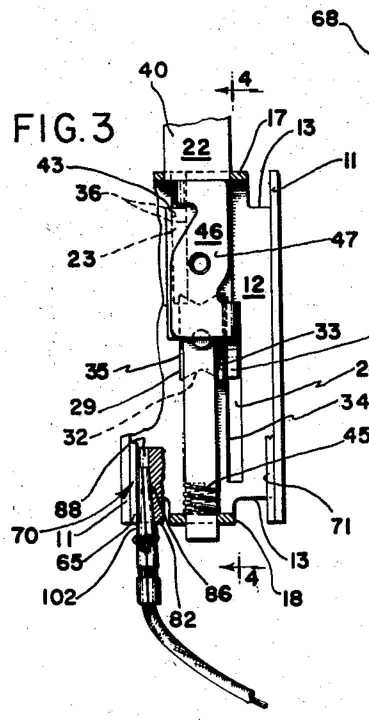
Fig. 3 is a fragmentary plan view of the plunger and rotary latch mechanism of Fig. 1.
Figure 4:
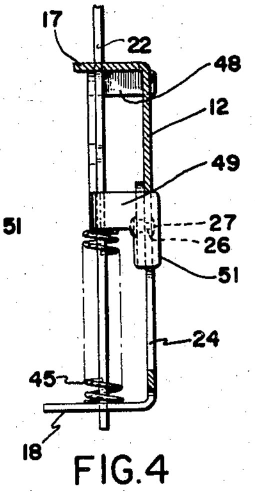
Fig. 4 is a cross sectional view taken along lines 4—4 of Fig. 3.

The plunger 22 has a relatively wide upper rectangular portion 40 (Fig. 2) and a relatively narrow bottom rectangular portion 41. The relatively wide portion is provided with a threaded bore 42, a rectangular notch 43 in one edge thereof, and a step notch 44 on a diagonally opposite edge adjacent the narrow portion 41 of the plunger. Adapted to be disposed about the narrow portion 41 is a cylindrical spring 45 which functions to bias the plunger 22 in an up position as shown in Figs. 3 and 4, and, as seen in Fig. 3, with the plunger in its up position, the notch 43 is adjacent the forwardly extending projection 17.

A switch latch 46 is adapted to be fixedly attached to the plunger, by a screw or the like, over and embracing the relatively wide portion 40 of the plunger. Toward this end the switch latch comprises a flat irregularly shaped body portion 47 which is rectangular in outline. The body portion has a bore through its center, and two tongues 48 and 49 projecting rearwardly from diagonally opposite ends thereof which embrace the plunger about notch 43 and step notch 44. The tongues 48 and 49 extend into the slots 23 and 24 respectively, and as seen most clearly in Figs. 1 and 4, the end of tongue 49 has an elongated portion 51 which extends downwardly at right angles from the tongue 49 toward the lower edge of the bottom wall 12 and within the slot 24.

Figure 6:
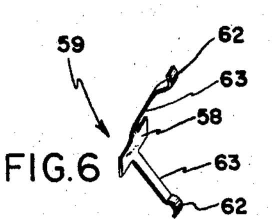
Fig. 6 is a perspective view of a contact brush.

As shown in Fig. 1 a pole mounting block 52, substantially rectangular in outline has formed in one end a channel 53 whereby the block 52 will fit over the latch 46 and plunger 22. A hole 54 bored through the block from end to end is adapted to receive a bolt 55 or the like whereby the plunger 22, latch 46, and block 52 are secured for movement together; with the sides of the block parallel to but spaced from the walls 11 of the switch housing. Each side of the block is provided with grooves 56 and 57 respectively, intersecting at right angles, which are adapted to receive and hold, as by a press fit, the body or anchor portions 58 of two spaced double contact brushes generally designated by reference numerals 59 and 60. As seen in Fig. 6 the contacts 62 of each brush are integral with two arms 63 which extend angularly away from the anchor portion 58; the contacts 62 being formed by bending the ends of the arms into semi-circles thereby to present, when the unit is assembled, a cylindrical surface to printed circuits adapted to be mounted or formed on the walls 11 of the switch housing.

Figure 7:
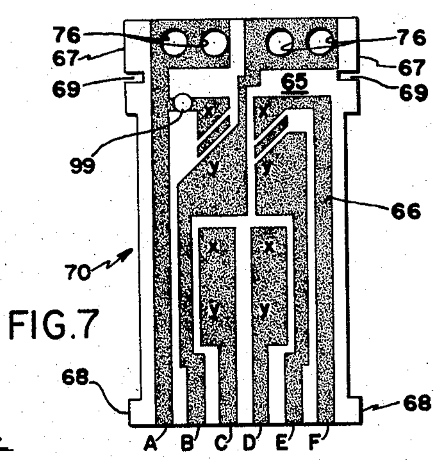
Fig. 7 is a plan view of a printed circuit panel.

Referring to Fig. 7 there is illustrated one form of a printed circuit panel comprising a flat plate 65 of suitable insulating material with suitable conductive material 66 deposited thereon. The insulating plate 65 carrying the conductive material is cut with upper and lower rectangular tabs 67 and 68 extending laterally from each of its corners. The upper tabs 67, which are relatively wider than the lower tabs 68 have cut therein lateral slots 69. The panels illustrated have a plurality of circuits A, B, C, D, E and F imprinted thereon, two of which (A and B) are extended to the body portion of the plate above the slots 69.

Two printed circuit panels 70 and 71 are employed in the switch construction and are adapted, in the specific embodiment, to be placed within the channel housing flatly adjacent the walls 11 thereof. As is apparent from Fig. 1 the long dimensions of the rectangular panels 70 and 71, from the bottom of the slots 69 to the bottom edge of the panels, is equivalent to the length of the walls 11 of the switch housing; the portion of the tabs 67 below the slots 69 therein and the lower tabs 68 being disposed in the notches 13 in the switch housing. A cover and separator plate 73 of suitable insulating material, cut with rectangular tabs 74 extending laterally from each of its corners, is placed over the upper edge of the switch housing. Each of the tabs 74 is adapted to fit into the slots 69 formed in the plates 65 carrying the printed circuits and within the corner notches 13 of the switch housing. As is obvious the cover plate 73 is provided with a rectangular cutout 75 adapted to fit around the projection 17 and to enable the plunger 22 to move freely.

As seen in Fig. 7, the portion of the plate 65 carrying the extensions of circuits A and B on panel 70 are provided with a plurality of holes 76; two in each circuit extension. A bulb holder 77 (Fig. 1) of conductive spring material is secured to the plate 65 over the extension of circuit B, as by riveting, thereby connecting one filament terminal of a bulb 78 inserted therein to circuit B. The other filament terminal of the bulb 78 is connected to circuit A by a conductive spring contact member 79 which is secured to the plate 65 over the extension of circuit A by rivets 80 or the like. As is apparent the bulb is serially connected between circuits A and B.

Referring again to Fig. 1 the lower end of the switch housing 10 is adapted to receive a substantially rectangular terminal block 82 of a suitable insulating material, such as nylon, which serves to maintain the lower ends of the printed circuit panels 70 and 71 separated and to close the lower end of the switch unit. The terminal block 82 is provided with a substantially rectangular channel 83 in its end 84 facing the bottom wall 12 of the housing whereby the spring and plunger 22 may move freely therethrough. The end 84 is also formed with two rearwardly extending projections 85 adapted to fit into the notches 13 in the housing. The sides of the block adjacent the printed circuits are provided with a plurality of vertical substantially semi-cylindrical grooves or channels 86. The grooves 86 taper from the bottom edges 87 of the block toward a straight semi-cylindrical portion 88. The upper forward end of the block is also formed with a rectangular lug 91 adapted to fit into a corresponding slot 92 in the cover plate 15 whereby the terminal block 82 will be fixed in position relative to the switch housing upon attachment of the cover plate 15. With the cover plate attached the forwardly extending tabs 67 and 68 of the panels extend into corner notches 93 thereof. Thereafter the lugs 14 on the walls 11, which extend through the slots 16, may be bent or staked to secure the cover plate 15 to the housing.

Figure 2:
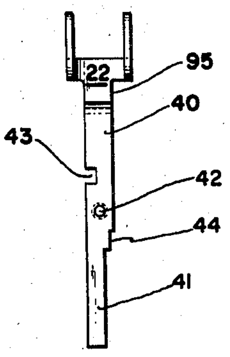
Fig. 2 is a full scale plan view of the plunger shown in Fig. 1.

As is apparent from Figs. 1 and 2 the upper end 95 of the plunger 22 is bent rearwardly of the portion 40 and is bifurcated forwardly and upwardly thereby to clear the bulb 78 and holder 77 over which a transparent cover 96 is placed and secured to the bifurcations.

Figure 5:
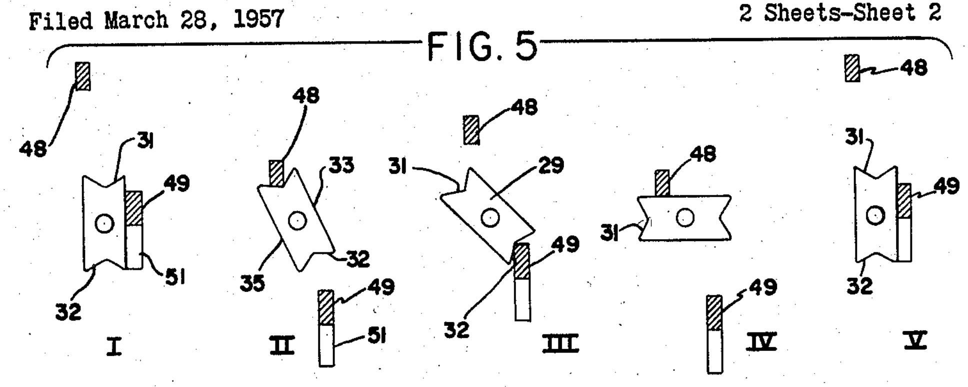
Fig. 5 is a schematic view showing the operation of the rotary latch mechanism.

The mechanical operation of the switch may be followed with reference to Fig. 5. From position I, which is that shown in Fig. 3, depression of the plunger 22 causes the tongue 48 to engage the triangular cutout 31 and to rotate the cam 29 through a predetermined arc to position II. Upon release of the plunger 22, tongue 49 engages the cam within its triangular cutout 32 and locks it in position III. In order to move the plunger 22 back to its up position, it is again depressed against the tension of spring 45 and tongue 48 moves the cam through a second predetermined arc to position IV. Upon release of the plunger tongue 49 rotates the cam back to its original position; the elongated extension 51 on tongue 49 preventing any over rotation of the cam.

Referring again to Fig. 7 there is illustrated one of many possible internal wiring arrangements in the form of a printed circuit panel. The panels utilized in the specific embodiment are identical although it is to be understood that any arrangement may be employed. As hereinbefore stated each panel is provided with six circuits A, B, C, D, E and F which are adapted to be connected to external wiring. The circuits on panel 70 read from A–F toward the bottom wall 12 and on panel 71 from A–F from the bottom wall 12. A branch of circuit A on the panel 70 carrying the light 78 is however cut at point 99 for reasons which will be apparent infra.

Switching is accomplished as follows: Assuming the high side of a power source is connected to circuits C and D on each of the panels, and utilization circuits to the A, B, E, F circuits, it is apparent that with the plunger in its up position the contacts 62 of brushes 59 and 60 riding on circuit panel 70 will bridge points $x$ on circuits A and C and circuits D and F respectively. Similarly the contacts 62 of brushes 59 and 60 riding on circuit panel 71 will bridge points $x$ on circuits A and C and D and F respectively.

In this up position (adopting the designation "on" to denote energized circuits and "off" to denote circuits not energized) circuits A and B and the lamp circuit on panel 70 will be "off" because of the break 99 in circuit A; circuit E will be off and circuit F on. On panel 71 circuits A and F will be "on" and circuits B and E will be "off."

Figure 8:
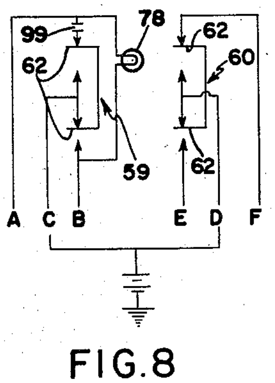
Fig. 8 is an electrical schematic of the transfer contacts on one side of the switch with the plunger in its up position.

Depression of the plunger to its down position causes the contacts of brushes 59 and 60 on each panel to bridge points $y$ on circuits B and C and D and E respectively. In this position the panel 70 circuits A, B and E, and the lamp circuit will be "on" and circuit F "off" while circuits B and E of panel 71 will be "on" and circuits A and F thereof "off." As is apparent each panel has two "transfer" or break-before-make contacts as schematically shown in Fig. 8.

Connection of external wiring to the printed circuits is accomplished in simple fashion by inserting taper pins 102 (Fig. 4) into the grooves 86 in terminal block 82; the taper grooves cooperating with the tapered pins to force the pins 102 in tight and secure engagement with the printed circuit panels.

As is apparent from the above there is provided a compact modular switch unit with four transfer contacts or two independent double pole double throw switches each having four output terminals which may be connected in accordance with a variety of combinations and wherein one transfer contact is utilized to indicate the state of all the transfer contacts. Further the construction is such that other keying or switching combinations for particular applications are possible by changing the printed circuit arrangements, and by increasing the number of printed circuits on a panel and the number of brush contacts riding thereon.

It should be understood, of course, that the foregoing disclosure relates to only a preferred embodiment of the invention and that it is intended to cover all changes and modifications of the example of the invention herein chosen for the purposes of the disclosure, which do not constitute departures from the spirit and scope of the invention.

The invention claimed is:

A slide switch construction comprising a housing, a pair of printed circuit panels mounted on opposite walls of said housing, said panels having a plurality of printed circuits thereon, a plunger mounted for movement within said housing between two positions, an insulating block mounted on said plunger, brushes mounted on said block for slidably engaging and bridging predetermined ones of said printed circuits, and means mounted between said printed circuit panels adjacent the terminals of the printed circuits thereon for connecting external wiring to said printed circuits, said last named means comprising an insulating block, a plurality of substantially semi-cylindrical grooves in said block facing said printed circuit panels, said grooves being tapered toward said panels, whereby external wiring terminals upon insertion into said grooves will be forced into tight engagement with the printed circuits on said panels.

References Cited in the file of this patent

UNITED STATES PATENTS

| | | |
|---|---|---|
| 1,981,987 | Bryce | Nov. 27, 1934 |
| 2,185,071 | Alcoran | Dec. 26, 1939 |
| 2,232,582 | Woods | Feb. 18, 1941 |
| 2,297,819 | Wagenknecht | Oct. 6, 1942 |
| 2,441,614 | Baumer | May 18, 1948 |
| 2,732,467 | Slate | Jan. 24, 1956 |
| 2,790,858 | Hung-Tu | Apr. 30, 1957 |
| 2,794,081 | Luhn | May 28, 1957 |